(12) United States Patent
Randall et al.

(10) Patent No.: US 6,918,179 B2
(45) Date of Patent: Jul. 19, 2005

(54) METHOD OF DEFORMING FLEXIBLE CABLE SECTIONS EXTENDING BETWEEN RIGID PRINTED CIRCUIT BOARDS

(75) Inventors: Lee Curtis Randall, Tucson, AZ (US); Thomas Stanley Truman, Tucson, AZ (US); Daniel James Winarski, Tucson, AZ (US); George G. Zamora, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 10/119,922

(22) Filed: Apr. 10, 2002

(65) Prior Publication Data

US 2003/0194913 A1 Oct. 16, 2003

(51) Int. Cl.[7] .................. H01R 43/00; H05K 13/00
(52) U.S. Cl. .................. 29/854; 29/270; 29/758; 29/764; 29/844; 29/868; 29/871; 174/254; 361/749; 361/750; 361/751; 439/493
(58) Field of Search .................. 29/270, 758, 764, 29/844, 854, 868, 871; 174/254; 361/749–751; 439/493

(56) References Cited

U.S. PATENT DOCUMENTS

| | | |
|---|---|---|
| 457,687 A | 8/1891 | Weimer |
| 2,902,535 A | 9/1959 | Francis |
| 3,027,417 A | 3/1962 | Turner, Jr. |
| 3,459,880 A | 8/1969 | Erdel |
| 3,647,936 A | 3/1972 | Dryg .......................... 174/69 |
| 4,379,361 A * | 4/1983 | Webster et al. ............... 29/857 |
| 4,660,125 A | 4/1987 | Purdy et al. ................. 361/391 |
| 4,987,442 A | 1/1991 | Uemori ........................ 355/50 |
| 5,170,326 A * | 12/1992 | Meny et al. ................. 361/736 |
| 5,419,038 A * | 5/1995 | Wang et al. .................. 29/830 |
| 5,446,240 A | 8/1995 | Hayakawa ..................... 174/69 |
| 5,877,936 A | 3/1999 | Nishitani ..................... 361/600 |
| 5,951,322 A | 9/1999 | Nishikigi ..................... 439/456 |
| 6,166,332 A | 12/2000 | Farrow ........................ 174/135 |
| 6,396,709 B1 * | 5/2002 | Schmich ...................... 361/760 |

FOREIGN PATENT DOCUMENTS

JP          08102342 A  *  4/1996  ............ H01R/9/07

OTHER PUBLICATIONS

"A comparitive analysis of an MCM implementation for an automotive controller"; Newberry, R.; Bosley, L.; Johnson, R.W.; Multichip Modules, 6th International Conference on , Apr. 2–4, 1997; pp: 323–328.*

* cited by examiner

Primary Examiner—Paul Kim
(74) Attorney, Agent, or Firm—Scully, Scott, Murphy & Presser; Jean M. Barkley, Esq.

(57) ABSTRACT

A method for preforming of two or more flexible cables in an arrangement consisting of a combination of rigid printed circuit boards and flexible cable sections extending therebetween. Moreover, also provided is an apparatus for the preforming of two or more flexible cable sections of a combination of rigid printed circuit boards and therewith interposed flexible cable sections which are adapted to interconnect the rigid printed circuit boards. The apparatus consists of a tool constituted of an elongated cylindrical member having a tapered leading end which narrows into an ultra-thin flat end section of a blade-like configuration, and which is adapted to be pushed between the flexible cables and so as to preform the flexible cable sections and cause them to yield in a predetermined outwardly bowed permanently relationship between the rigid printed circuit boards at the opposite ends thereof to lengthen the fatigue life of the conductors in the flexible cable sections.

8 Claims, 4 Drawing Sheets

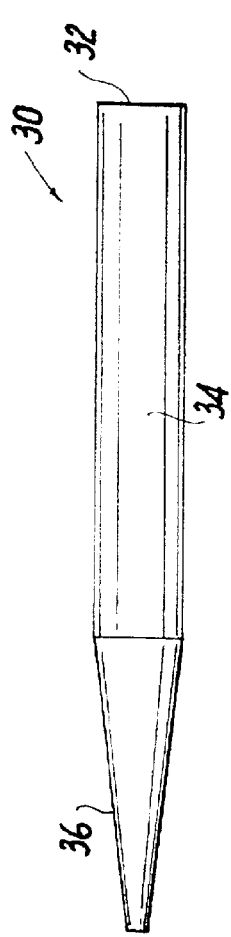
Figure 2A
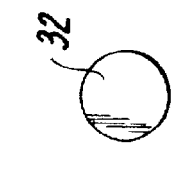
Figure 2C
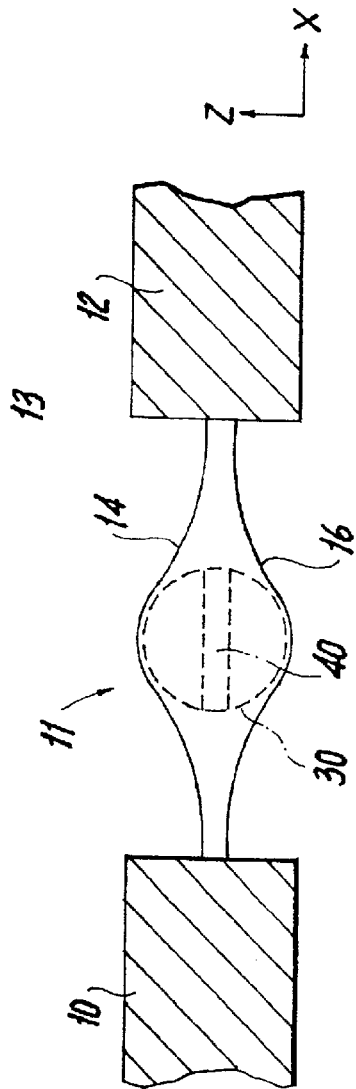
Figure 2B
Figure 3

METHOD OF DEFORMING FLEXIBLE CABLE SECTIONS EXTENDING BETWEEN RIGID PRINTED CIRCUIT BOARDS

BACKGROUND OF THE INVENTION

1. Field of the Invention

The present invention relates to a method for preforming of two or more integrated connectorless flexible cables in flexible sections of a rigid-flex printed circuit board consisting of a combination of rigid printed circuit board sections and flexible printed circuit board sections extending therebetween. Moreover, the invention is also directed to an apparatus for the preforming of two or more integrated connectorless flexible cables in flexible sections of a rigid-flex printed circuit board consisting of a combination of rigid printed circuit board sections and therewith interposed flexible printed circuit board sections which are adapted to interconnect the rigid printed circuit board sections.

In the electronic packaging industry, there are provided operatively joined wherein pluralities of rigid printed circuit board (PCB) sections which are essentially interconnected through the intermediary of flexible printed circuit board sections. In the case of numerous physical instances and applications, these combinations of rigid printed circuit board sections and flexible printed circuit board sections, referred to as rigid-flex printed circuit boards, are employed in order to solve three-dimensional space problems, reduce electrical noise by eliminating connectors and reducing the overall area of the printed circuit board. Basically, the flexible printed circuit board sections enable the therewith joined rigid printed circuit board sections to be folded and unfolded relative to each other through predetermined angular displacements, normally, although not necessarily angled, in 90° segments, 180° segments, or any arbitrary angle greater than 0° up to 180°, in order to form a three-dimensional printed circuit board structure.

Generally, in order to interconnect pluralities of printed circuit boards with each other, there are presently employed connectors and cables with connectors on each end, as is well known in the electronic packaging industry. However, the uses of such connectors are subject to limitations and disadvantages, in that these connectors add an expense to the printed circuit board structures, the connectors frequently cause electrical noise in the utilization of the electronic packages in which the printed circuit boards are installed, and moreover, such connectors represent points of failure in the overall packaging system. Consequently, it is highly desirable to provide a rigid-flex printed circuit board which combines rigid printed circuit board sections and flexible printed circuit board sections which extend therebetween in order to provide three-dimensional printed circuit board structures in which the presently employed connectors are eliminated, thereby substantially obviating or at least considerably ameliorating all of the foregoing limitations and drawbacks. Specifically, the rigid printed circuit board sections are for component and hardware placement. The flexible printed circuit board sections provide for three-dimensional forming, thereby eliminating the requirement for board-to-board connectors. The elimination of these unnecessary connectors frees up valuable surface area for hardware and component placement or reduces the size and cost of the rigid-flex printed circuit board.

In current rigid-flex printed circuit board constructions, wherein at least two or more rigid printed circuit board sections are operatively interconnected through the intermediary of flexible printed circuit board sections comprised of two integrated connectorless cables, the flexible printed circuit board sections are folded so as to, for example provide a 90° or a 180° angled construction. The rigid-flex printed circuit board structure is assembled in a two-dimensional or flat state, electrically tested, folded into a three-dimensional state, electrically retested at the location of the assembly supplier, and then inserted into a suitable bottom sheet metal cover comprising a protector. However, if a rigid-flex printed circuit board fails subsequent to electrical retesting thereof, then the assembly supplier unfolds the entire rigid-flex printed circuit board electronic package for reworking.

The foregoing folding and subsequent unfolding from two-dimensions and three-dimensions, and conversely, may frequently cause an early life conductor fatigue failure in the integrated connectorless flexible cables contained within the flexible printed circuit board sections of the rigid-flex printed circuit board structure. Consequently, such operations necessitating folding and unfolding cycles may, at times, due to breakage of one or more conductors caused by fatigue failure, result in having to permanently scrap extremely expensive rigid-flex printed circuit board structures.

In view of the foregoing, it is of importance in the electronic packaging industry to be able to provide for of rigid-flex printed circuit boards with flexible printed circuit board sections which interconnect various rigid printed circuit board sections, whereby problems of flexing the integrated connectorless flexible cable sections do not lead to an early fatigue and failure of the conductors within the flexible printed circuit board sections between the rigid printed circuit board sections.

2. Discussion of the Prior Art

Although the technology has addressed itself to various methods and types of apparatus for controlling bends and flexure in cables extending rigid connecting structures, these have not fully considered the problem addressed by the present invention.

Farrow, et al. U.S. Pat. No. 6,166,332 discloses a method and apparatus for securing a ribbon cable in a bent position, wherein the ribbon cable is maintained in a cable clamping apparatus while being kept from interfering with the electrical conduction of the cable. In particular, the clamping apparatus merely maintains a central point of the cable in a predetermined bent position for electrical testing. There is no consideration as disclosed by the present invention for preforming two or more parallel flexible cable sections which are subjected to two-dimensional and three-dimensional folding and unfolding to accommodate the orientation of printed circuit boards to which the flexible cables are attached. Consequently, this patent does not address itself to and has nothing in common with the present invention.

Nishikigi U.S. Pat. No. 5,951,322 provides for the bending of a flat cable connection structure to obtain strain relief to be able to impart a bend thereto without imparting any excessive stresses thereto. This type of construction does not pertain to multiple flexible layer cable sections which are adapted to be folded in angled segments to form a three-dimensional printed circuit board. Again, this patent has nothing in common with the present invention.

Nishitani et al. U.S. Pat. No. 5,877,936 discloses an expansion structure for door-mounted electrical circuit bodies, wherein an electrical cable is adapted to be folded in loops such that door structures which extend are able to stretch or, alternatively, fold the cable loop within a guide protector. The contraction of the circuit body and expansion thereof responsive to closing or opening of a door has nothing in common with imparting a preformed configuration to a flexible cable section intermediate rigid printed circuit boards adapted to prevent any potential damage to copper or metallic layers within the flexible cable.

Hayakawa et al. U.S. Pat. No. 5,446,240 discloses the flexing of a flexible cable structure to prevent undue deformation thereof, and to form various loop configurations during flexing and twisting through bending of opposite side portions of an intermediate length of cable. This patent does not address itself to the particular problems solved by the present invention.

Uemori U.S. Pat. No. 4,987,422 discloses a wiring device in which a ribbon cable is provided in a loop and in a C-shaped section adapted to be pulled in a manner whereby a movable portion is displaced relative to an immovable portion or member of the cable. This has nothing in common with the inventive concept.

Purdy et al. U.S. Pat. No. 4,660,125 discloses a ribbon cable assembly whereby the latter is adapted to be folded or unfolded in conjunction with the movement of the pull-out draw of an electronic equipment cabinet. Again, this has nothing in common with the particular invention as described herein.

Dryg U.S. Pat. No. 3,647,936 basically describes a self folding cable carrier in which the extension of a drawer unfolds a plurality of loops of flexible cable, and upon closing of the drawer, the flexible cable will slide back in to a tight loop-forming arrangement. This has nothing in common with the present invention.

Erdle U.S. Pat. No. 3,459,880 discloses a flexible bus bar with S-shaped cable sections which are adapted to be conveyed across a system of rollers to compensate for movements of a cabinet door. This has nothing in common with the inventive construction.

Turner, Jr. U.S. Pat. No. 3,027,417 discloses an extensible electrical cable which is adapted to be slid out from an inter-engaged telescoped coiled position into an axial extension by being unwound along a longitudinal axis.

Francis U.S. Pat. No. 2,902,535 merely discloses a prefolded card which may be wound over retaining rod-shaped holders in a continuous multi-loop like configuration.

Finally, Weimer U.S. Pat. No. 457,687 discloses an electric light hanger in which a coiled electrical cable is adapted to be extended or retracted relative to a base support structure.

SUMMARY OF THE INVENTION

Although all of the foregoing prior art publications relate to various aspects of explicabilities of flexible cables or electrical wiring, none of these concern themselves, unlike the present invention, with enabling integrated connectorless flexible cables constituting electrically conductive connections within flexible printed circuit board sections to be preformed by an apparatus causing integrated connectorless flexible cable sections located in a region approximately at the center of the length of the flexible printed circuit board section intermediate to rigid printed circuit board sections, whereby this preforming outwardly bows each integrated connectorless flexible cable so as ensure a specified permanently separation of the integrated connectorless flexible cables; so as to thereby reduce and more evenly distribute stress and strains in the conductor in the integrated connectorless flexible cables during folding and unfolding of the flexible printed circuit board sections. This preforming also prevents creasing of the integrated connectorless flexible cables during folding and unfolding inasmuch as such creasing would significantly reduce the fatigue life of the conductors of possibly cause immediate electrical failure.

In order to attain the advantages, pursuant to the invention, an apparatus which comprises a tool constituted of an elongated cylindrical member has a tapered leading end which narrows into an ultra-thin flat end section of a blade-like configuration, and which is adapted to be pushed between the integrated connectorless flexible cables and so as to preform these integrated connectorless flexible cables and cause them to yield in a predetermined outwardly bowed permanent relationship between the rigid printed circuit board sections at the opposite ends thereof. This outward bowing of the integrated connectorless flexible cable sections imparts a permanent deformation thereto responsive to the insertion of the tool therebetween and advancing the tool between the integrated connectorless flexible cable sections to permanently form a widened spacing therebetween. Thereafter, upon the folding or bending of the printed circuit boards relative to each other from a two-dimensional into a three-dimensional configuration which imparts a bend to the flexible printed circuit board sections, an outer integrated connectorless flexible cable section will be flexed so as to assume what may generally be described as a simple arc whereas an inner integrated connectorless flexible cable section responsive to the bend of the flexible printed circuit board section will assume the configuration of an inwardly depending loop, in the general form of an "omega" which, at times is referred to as a so-called omega loop. This bending into an omega loop of the inner integrated connectorless flexible cable section will prevent any undue excessive stresses or strains to be encountered by the conductor layer or layers in the integrated connectorless flexible cables which would result in a shortening of the service life of the rigid-flex printed circuit board structure caused by the folding and unfolding thereof.

Accordingly, it is an object of the present invention to provide an apparatus for imparting a predetermined permanent deformation between the integrated connectorless flexible cable sections comprising the flexible printed circuit board section intermediate opposite ends thereof extending into rigid printed circuit board sections.

Another object of the present invention resides in providing an apparatus comprising a tool which is adapted to be inserted between integrated connectorless flexible cable sections therein so as to separate and permanently deform the integrated connectorless flexible cable sections relative to each other, whereby folding of the printed circuit boards into a three-dimensional configuration causes an outer integrated connectorless flexible cable section to assume a generally simple arc, whereas an inner integrated connectorless flexible cable section assumes an inwardly depending loop-shaped configuration.

Another object of the present invention resides in the provision of a unique tool for separating integrated connectorless flexible cable sections extending between rigid printed circuit board sections, wherein the tool comprises an elongated cylindrical member extending at its leading end into an ultra-thin blade like configuration adapted to be passed between integrated connectorless flexible cable sections so as to cause the cylindrical portion of the tool to separate the integrated connectorless flexible cable sections in a predetermined permanent deformed position relative to each other.

Yet another object of the present invention resides in the provision of a method for deforming integrated connectorless flexible cable sections extending intermediate rigid printed circuit boards so as to reduce potential strains and stresses in conductor layers of the integrated connectorless flexible cable sections responsive to three dimensional deformation or folding of the rigid printed circuit board sections relative to each other.

Still another object of the present invention resides in the provision of a method wherein responsive to a permanent deformation of integrated connectorless flexible cable sections within a flexible printed circuit board section which extends between rigid printed circuit board sections, upon the bending thereof through an angular displacement, an outer integrated connectorless flexible cable section will assume a generally simple bent arc whereas an inner integrated connectorless flexible cable section of the flexible printed circuit board section will assume an inwardly depending loop configuration, so as to thereby reduce any strains encountered in the conductive layer or layers of the integrated connectorless flexible cable sections responsive to the bending of the flexible printed circuit board sections.

BRIEF DESCRIPTION OF THE ACCOMPANYING DRAWINGS

Reference may now be made to the following detailed description of preferred embodiments of the invention, taken in conjunction with the accompanying drawings, in which:

FIGS. 2A, 2B and 2C illustrate, respectively, side, leading end and rear end views of an apparatus comprising a tool for preforming the integrated connectorless flexible cable sections so as to permanently deform the shapes of the integrated connectorless flexible cable sections relative to each other;

FIG. 3 illustrates the rigid printed circuit board sections and integrated connectorless flexible cable arrangement of FIGS. 1A and 1B subsequent to the integrated connectorless flexible cable sections having been permanently deformed so as to be bowed outwardly relative to each other through the utilization of the tool illustrated in FIGS. 2A through 2C of the drawings;

Figure 4:
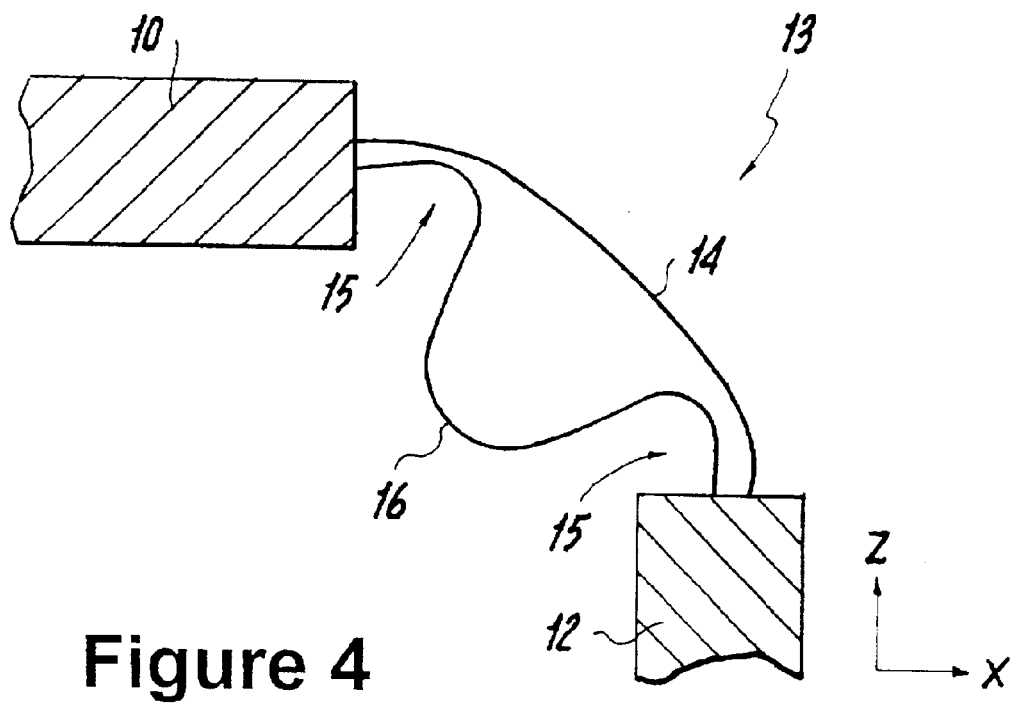
Figure 5:
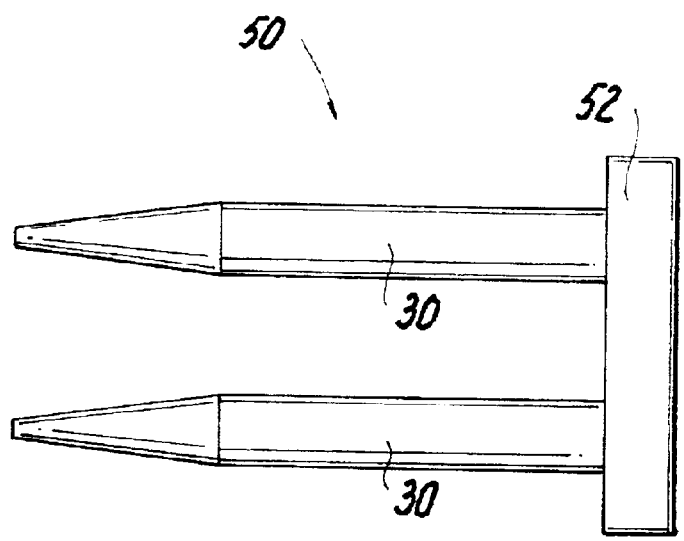

FIG. 4 illustrates the rigid printed circuit board sections and integrated connectorless flexible cable sections in a three-dimensionally folded configuration at 90° relative to each other, showing the unique bending mode of the integrated connectorless flexible cable sections responsive to having been permanently deformed by the tool of FIG. 2, and FIG. 5 illustrates another embodiment of an apparatus including a plurality of tools similar to that of FIGS. 2A through 2C for concurrently preforming a larger number of cable integrated connectorless flexible cable sections.

DETAILED DESCRIPTION OF PREFERRED EMBODIMENTS

Figure 1A:
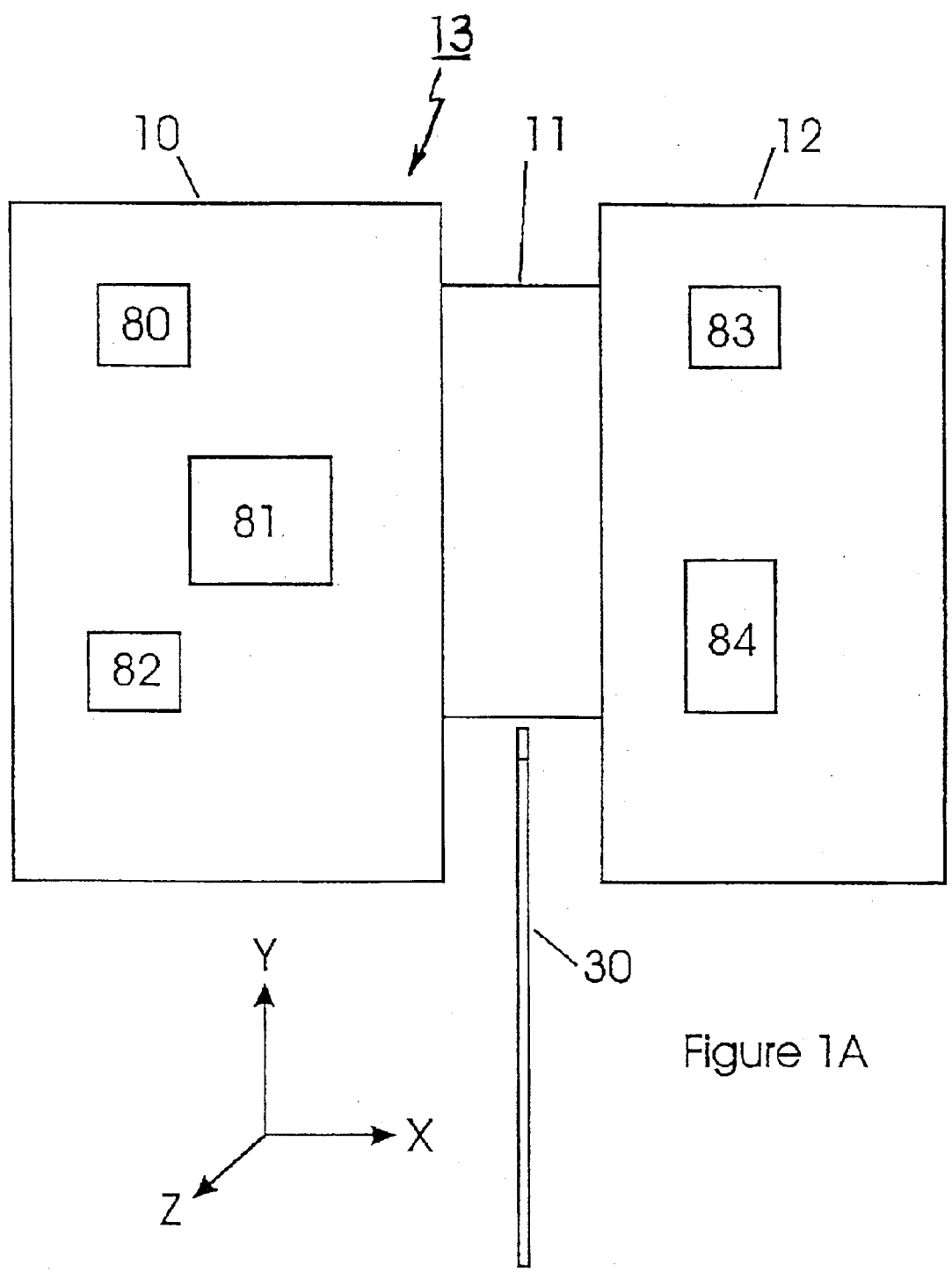
FIG. 1A illustrates, generally diagrammatically, a top view of a pair of rigid printed circuit board sections which are interconnected by means of a flexible printed circuit board section.
Figure 1B:
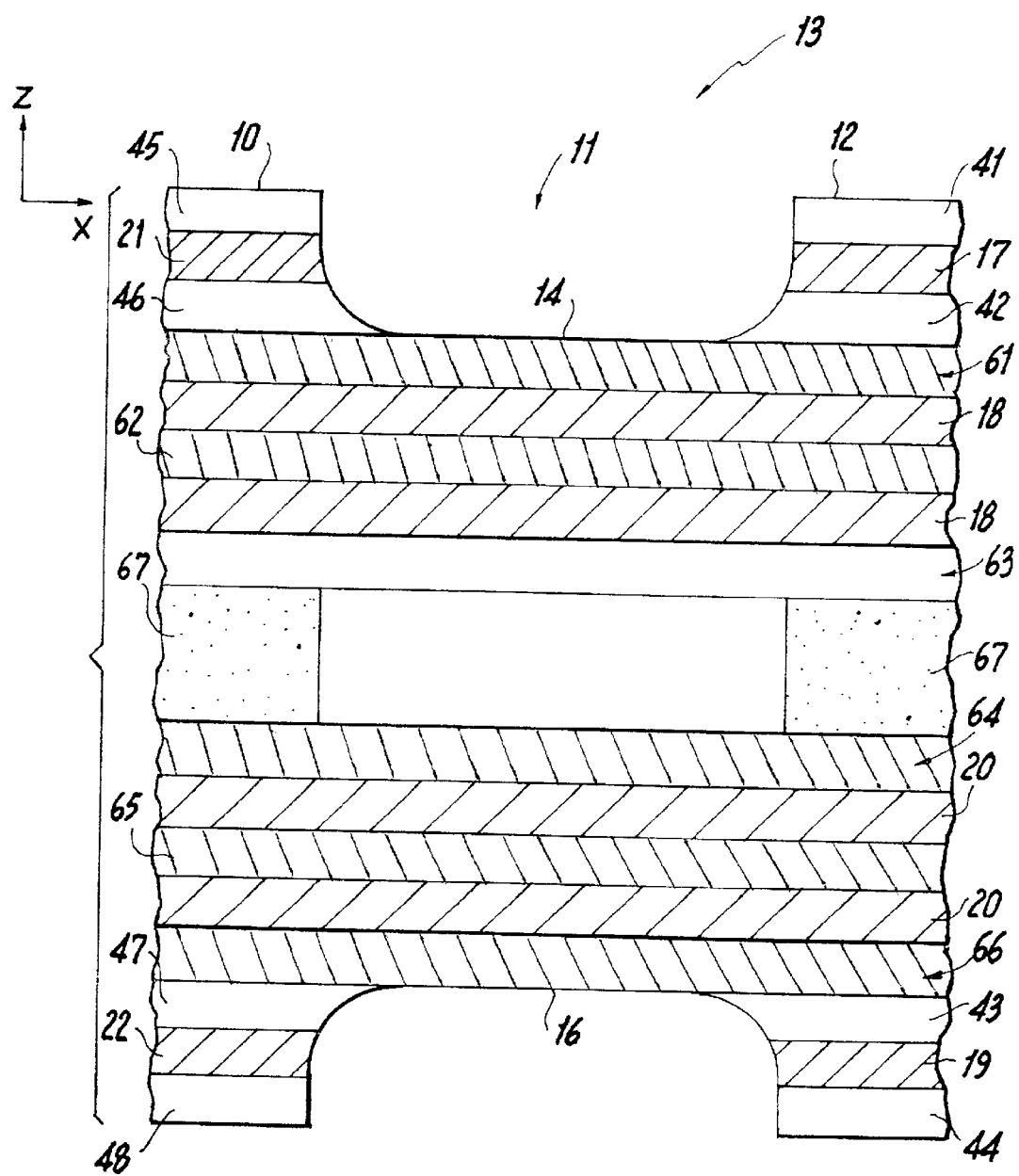
FIG. 1B illustrates, generally diagrammatically a cross-sectional view of a pair of rigid printed circuit board sections which are interconnected by means of a flexible printed circuit board section comprising a pair of integrated connectorless flexible cable sections extending in parallel spaced relationship between the rigid printed circuit board sections.

Referring now specifically to FIGS. 1A and 1B of the drawings, there is illustrated a rigid-flex printed circuit board 13 comprised of a first rigid printed circuit board section 10, and with a second rigid printed circuit board section 12 interconnected therewith through a flexible printed circuit board 11.

In FIG. 1A, rigid printed circuit board section 10 has electrical components 80, 81, and 82 surface mounted to it. Rigid printed circuit board section 12 has electrical components 83 and 84 surface mounted to it. Electrical components 80, 81, 82, 83 and 84 are typically semiconductor chips such as microprocessors read-only memory (ROM) chips containing microcode used by microprocessors chips, or random-access memory (RAM) chips for buffering input to or output from the microprocessor chips. Because of the delicate nature of electrical components 80, 81, 82, 83, and 84, they are mounted to rigid printed circuit board sections 10 and 12.

FIG. 1B illustrates that a first rigid core of rigid printed circuit board 10 is comprised of cover layer 45 and cover layer 46 with conductive layer 21 sandwiched therebetween. A first rigid core of rigid printed circuit board 12 is comprised of a cover layer 41 and cover layer 42 with conductive layer 17 sandwiched therebetween. A second rigid core of rigid printed circuit board 10 is comprised of a cover layer 47 and cover layer 48 with conductive layer 22 sandwiched therebetween. A second rigid core of rigid printed circuit board 12 is comprised of cover layer 43 and cover layer 44 with conductive layer 19 sandwiched therebetween.

Cover layers 41, 42, 43, 44, 45, 46, 47 and 48 are typically either layers of epoxy-glass or polyimide-glass. It is the glass in these cover layers 41, 42, 43, 44, 45, 46, 47 and 48 which adds stiffness to rigid printed circuit boards 10 and 12 so that a plurality of electrical components can be safely surface mounted to them.

A first flexible core of flexible printed circuit board 11 is comprised of cover layer 61, base layer 62, cover layer 63, and conductive layers 18 sandwiched therebetween. A second flexible core of flexible printed circuit board 11 is comprised of cover layer 64, base layer 65, and cover layer 66, and conductive layers 20 sandwiched therebetween. Because the first flexible core extends through and is electrically contiguously with rigid printed circuit board sections 10 and 12, that portion of the first flexible core spanning flexible printed circuit board section 11 is termed integrated connectorless flexible cable section 14. Similarly, because the second flexible core extends thorough and is electrically contiguously with rigid printed circuit board sections 10 and 12, that portion of the second flexible core spanning flexible printed circuit board section 11 is termed integrated connectorless flexible cable section 16.

Cover layers 61, 63, 64 and 66 as well as base layers 62 and 65 are typically polyimide. It is the absence of glass fiber in the polyimide in cover layers 61, 63, 64, and 66 as well as base layers 62 and 65 which provides the flexibility to integrated connectorless flexible cable sections 14 and 16 and, thus, to flexible printed circuit board section 11.

Conductor layers 17, 18, 19, 20, 21 and 22 preferably comprise copper conductors. However, conductor layers 17, 18, 19, 20, 21 and 22 may alternately comprise gold, aluminum, or other electrically conductive metals. Additionally, conductor layers 17, 18, 19, 20, 21 and 22 could comprise nonelectrical conductors, such as optical or fiber-optic conductors.

FIG. 1B shows just one possible cross-section of a rigid-flex printed circuit board 13. First rigid core of rigid printed circuit board 12 may have more than one conductive layer 17. First rigid core of rigid printed circuit board 10 may have more than one conductive layer 21. Second rigid core of rigid printed circuit board 10 may have more than one conductive layer 22. And, second rigid core of rigid printed circuit board 12 may have more than one conductive layer 19. Also, first flexible core of flexible printed circuit board 11 may have only one or more than two conductive layers 18. Finally, second flexible core of flexible printed circuit board 11 may have one or more than two conductive layers 20. Thus, this invention applies to a family of rigid-flex printed circuit boards 13.

In between integrated connectorless flexible cable sections 14 and 16 are located epoxy-glass or polyimide-glass spacers 67. Spacers 67 are provided only in rigid printed circuit board sections 10 and 12 and not flexible printed board section 11. Spacers 67 create a space for the insertion of tool 30 along the Y axis, as shown in FIG. 1A, between integrated connectorless flexible cable sections 14 and 16, as shown in FIG. 3.

In essence, the so-called rigid-flex printed circuit board 13 is produced utilizing conventional print/develop/etch/strip/photolithography, as is well known in the electronic packaging manufacturing industry. The rigid printed circuit board sections of the rigid-flex printed circuit board are generally populated with electrical components while in a two-dimensional or flat state within a card panel (not shown) and then electrically tested. Once all of the components have been soldered, the rigid-flex printed circuit board is removed from the card panel and folded into its three-dimensional shape, either manually or though automatic/robotic tooling, and then electrically tested again. In the event that the three-dimensional rigid-flex printed circuit board fails this second electrical test the rigid-flex printed circuit board is unfolded and retested to determine the mode or cause of failure. Once the rigid-flex printed circuit board passes all electrical testing then the rigid-flex printed circuit board is reformed or folded back into its three-dimensional configuration and inserted into the next higher assembly of the manufacturing process. Consequently, the manufacture and quality assurance testing of the cross-section of the construction involves imparting a specific number of flexes to the integrated connectorless flexible cable sections 14 and 16 containing the conductor layers 18 and 20. Inasmuch as the folding and unfolding and thereafter again folding of the components imparts considerable stresses and strains to the integrated connectorless flexible cable sections 14 and 16 and especially the conductive layers 18 and 20 thereof, this may result in the failure of the latter, resulting in having to possibly discard and scrap an entire expensive circuit board arrangement.

Pursuant to the invention, in order to reduce any stresses and strains in the flexible integrated connectorless flexible cable sections 14 and 16, and especially in the conductor layers 18 and, 20, as shown in FIGS. 2a through 2c, there is provided a tool 30 which in its one rear end 32 and body 34 is essentially of a circular or cylindrical cross-sectional shape. The tool 30 has a forward portion 36 which tapers from the cylindrical body 34 into a flat forward tool end 38 which forms an ultra-thin flat blade 40 extending across its length. The tool is utilized by being inserted at its end 38 between integrated connectorless flexible cable sections 14 and 16. In this case, the blade 40 has a range of widths of approximately 5% to 30% the length of the integrated flexible cable sections 14 and 16 between the rigid printed circuit board sections 10 and 12. The diameter of body 34 is approximately the width of blade 40. Consequently, as the leading edge 38 of the tool 30 which has the ultra-thin blade configuration is pushed between integrated connectorless cables 14 and 16, the integrated connectorless flexible cable sections 14 and 16 are each outwardly deformed so as to leave a wider space therebetween than when originally manufactured, as shown in FIG. 3 of the drawings. Consequently, this ensures a separation between the integrated connectorless flexible cable sections and deforms in permanent state the integrated connectorless flexible cable sections 14 and 16. In the event that this procedure is implemented through the separation which is effected by the tool 30, when the rigid-flex printed circuit board is unfolded and then refolded the physical behavior remains identical, and the load distribution is more uniform across the entire length of the integrated connectorless flexible cable sections between the rigid printed circuit boards sections 10 and 12. Accordingly, it is possible to increase flexing cycles into hundreds of cycles prior to any conductor fatigue failure being encountered by the structure.

Additionally, the process of inserting tool 30 between integrated connectorless flexible cable sections 14 and 16 allows the determination to be made if any inadvertent adhesion took place during manufacturing between cover layers 63 and 64 of FIG. 1B. Any inadvertent adhesion between cover layers 63 and 64 would seriously reduce the fatigue life of rigid-flex printed circuit board 13. If tool 30 passes the entire length of integrated connectorless flexible cable sections 14 and 16 without incident, then the process is deemed successful. However, if a snapping noise is heard, which would be caused by the breaking of inadvertent adhesion between cover layers 63 and 64, then that rigid-flex printed circuit board would be rejected from use and send to failure analysis.

As shown in FIG. 3, in that instance, the rigid printed circuit board sections 10 and 12 which are interconnected by the now bowed out and deformed integrated connectorless flexible cable sections 14 and 16 are in their two-dimensional or "flat" state. However, upon a simple folding or bending of the printed wiring board relative to each other as shown in FIG. 4, such as through an angle of 90° to form a three-dimensional structure, although other angles equally applicable thereto, this shows the configuration of the previously deformed integrated connectorless flexible cable sections 14 and 16 with the conductor layers 18 and 20 between the rigid printed circuit board sections 10 and 12. This previous yielding of the cables responsive to the insertion of the tool 30 and the permanent set thereof as shown in FIG. 3, has a dramatic and unexpected result on the simple bending of the cables and conductor layers upon deformation or folding/unfolding of the rigid printed circuit boards 10 and 12 relative to each other. Thus, the outer integrated connectorless flexible cable section 14 with conductor layer or layers 18, with regard to the folding shown in FIG. 4 of the drawings, accommodates the angulation of the rigid printed circuit board sections at its opposite ends by simply bending in a generally simple arc. However, the inner integrated connectorless flexible cable section 16 which contains the conductor layer or layers 20 accommodates the folding of the rigid printed circuit board sections relative to each other by deforming into a generally looped shaped configuration extending inwardly into the radius of the bend. The loop shaped configuration of integrated connectorless flexible section 16 in FIG. 4 is referred to as an "omega loop". This unexpected and extremely advantageous deformation of the profile of the inner integrated connectorless flexible cable section 16 and conductor layer or layers 20 into the "omega loop" results in that the fatigue limit of the conductor increases substantially by over an order of magnitude. Consequently, this clearly increases the service life of such flexible printed circuit board sections comprised of integrated connectorless cable sections and contiguous connections with rigid printed circuit board sections or similar structures by the simple expedient of deforming the integrated connectorless flexible cable sections 14 and 16 and conductor layers 18 and 20 relative to each other in a manner as described hereinabove.

It should be noted in FIG. 4, that sub-loops 15 in integrated connectorless flexible cable section 16 may actually touch integrated connectorless flexible cable section 14.

As illustrated in FIG. 5 of the drawings, it is also possible to contemplate a plurality of rigid printed circuit boards which are connected to a plurality of flat integrated connectorless cables each having conductor layers provided therein. In order to properly bow or separate these cables and conductor layers in a deformed manner, a comb-shaped configuration of the apparatus 50 may be employed as shown in FIG. 5 of the drawings. In that instance, a support element 52 contains two or more of the tools 30, as illustrated in FIG. 2 of the drawings, in predetermined spaced relationship relative to each other so as to be able to concurrently deform a plurality of flat integrated connectorless flexible cable sections. Each of the tools 30 has an ultra-thin flat blade section 40 ranging in width of approximately 5%–30% the flex length and the diameter of shaft 34 is approximately the width of blade section 40.

From the foregoing it becomes readily apparent that pursuant to the invention there is obtained an extremely simple and novel apparatus and method of utilization thereof which will deform the various portions of the flexible cables so as to, upon folding and unfolding of rigid printed circuit board sections interconnected by flexible printed circuit board sections, reduce any strains and stresses encountered in the integrated connectorless cables, and particularly any conductive layers arranged therein.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A method of deforming flexible cable sections extending between rigid printed circuit boards which are foldable into specific angular positions relative to each other, said method comprising:

providing at least first and second said flexible cable sections arranged therein in close parallel relationship said at least one first flexible cable section comprising an outer flexible conductive cable connection and said at least one second flexible cable section comprising an inner flexible conductive cable connection with said rigid printed circuit boards, wherein folding of said rigid printed circuit boards into an angled three-dimensional configuration deforms said at least one first flexible cable section into an arcuate configuration, and said at least one second flexible cable section deforms into a radially inwardly directed loop-shaped configuration;

passing at least one tool between said at least first and second flexible cable sections, said tool being dimensioned so as to spread said flexible cable sections apart so as to reduce strains generated therein during folding movements of said rigid printed circuit boards resulting in flexural bending of said at least first and second flexible cable sections.

2. The method as claimed in claim 1, wherein said spreading apart of said at least first and second flexible cable sections imparts a permanent outwardly bowed deformation thereto intermediate said rigid printed circuit boards.

3. The method as claimed in claim 1, wherein said loop-shaped configuration of said second flexible cable section comprises an omega shape.

4. The method as claimed in claim 1, wherein said tool comprises an elongated cylindrical member having a forward end tapering into an ultra-thin blade extending across the diametrical width of said cylindrical member.

5. The method as claimed in claim 4, wherein said cylindrical member of said tool has a diameter ranging between 5% and 30% of the length of said flexible cable sections.

6. The method as claimed in claim 1, wherein a plurality of said tools are mounted on a support for concurrently deforming a plurality of said conductor layers into outwardly bowed spacings relative to each other.

7. The method as claimed in claim 6, wherein said support mounts said plurality of tools in a comb-shaped spaced arrangement.

8. The method as claimed in claim 1, further comprising: rejecting said flexible cable sections extending between said rigid printed circuit boards if said flexible cable sections have adhered and said tool cannot pass between said flexible cable sections without an audible noise emitted caused by a breaking of adhesion between components of said flexible cable sections indicative of a failure of flexible cable sections.

* * * * *